US009508688B2

(12) United States Patent
Kim

(10) Patent No.: US 9,508,688 B2
(45) Date of Patent: Nov. 29, 2016

(54) SEMICONDUCTOR PACKAGES WITH INTERPOSERS AND METHODS OF MANUFACTURING THE SAME

(71) Applicant: SK hynix Inc., Icheon-si Gyeonggi-do (KR)

(72) Inventor: Jong Hoon Kim, Suwon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/850,283

(22) Filed: Sep. 10, 2015

(65) Prior Publication Data
US 2016/0300815 A1    Oct. 13, 2016

(30) Foreign Application Priority Data

Apr. 13, 2015 (KR) .................. 10-2015-0052037

(51) Int. Cl.
| H01L 23/48 | (2006.01) |
| H01L 23/52 | (2006.01) |
| H01L 29/40 | (2006.01) |
| H01L 25/065 | (2006.01) |
| H01L 23/538 | (2006.01) |

(52) U.S. Cl.
CPC ....... *H01L 25/0657* (2013.01); *H01L 23/5384* (2013.01)

(58) Field of Classification Search
CPC .................. H01L 25/0657; H01L 23/5384
See application file for complete search history.

(56) References Cited

U.S. PATENT DOCUMENTS

| 2010/0290193 A1* | 11/2010 | Liu ......................... H01L 23/36 361/709 |
| 2014/0029639 A1* | 1/2014 | Zarbock ................ H01L 25/167 372/50.1 |
| 2014/0191419 A1* | 7/2014 | Mallik ................ H01L 25/0652 257/777 |
| 2014/0217604 A1* | 8/2014 | Chou ....................... H01L 24/11 257/774 |
| 2014/0217610 A1* | 8/2014 | Jeng ..................... H01L 23/5389 257/774 |
| 2016/0027764 A1* | 1/2016 | Kim ....................... H01L 24/97 257/686 |
| 2016/0064328 A1* | 3/2016 | Kwon ................... H01L 25/071 327/565 |

FOREIGN PATENT DOCUMENTS

KR    1020130033375 A    4/2013

* cited by examiner

*Primary Examiner* — Victor A Mandala
(74) *Attorney, Agent, or Firm* — William Park & Associates Ltd.

(57) ABSTRACT

A semiconductor package may include a first semiconductor chip, a second semiconductor chip disposed to overlap with a portion of the first semiconductor chip and connected to the first semiconductor chip through first coupling structures. The semiconductor package may include an interposer disposed to overlap with another portion of the first semiconductor chip and may be connected to the first semiconductor chip through second coupling structures. A first surface of the interposer may face the first semiconductor chip, and the interposer may include second internal interconnectors extending from the second coupling structures on the first surface to a second surface of the interposer opposite to the first face. External interconnectors may be disposed on the second surface of the interposer and are connected to the second internal interconnectors.

19 Claims, 18 Drawing Sheets

SEMICONDUCTOR PACKAGES WITH INTERPOSERS AND METHODS OF MANUFACTURING THE SAME

CROSS-REFERENCE TO RELATED APPLICATION

The present application claims priority under 35 U.S.C 119(a) to Korean Application No. 10-2015-0052037, filed on Apr. 13, 2015, in the Korean intellectual property Office, which is incorporated herein by reference in its entirety.

BACKGROUND

1. Technical Field

Embodiments of the present disclosure generally relate to semiconductor package technologies and, more particularly, to semiconductor packages with interposers and methods of manufacturing the same.

2. Related Art

Semiconductor packages which are capable of processing a large amount of data are increasingly in demand with the development of smaller electronic systems. Recently, system-in-package (SIP) techniques for encapsulating a plurality of semiconductor chips having different functions in a single package have been proposed to provide high performance electronic systems. As a result of the SIP techniques, a lot of effort has been focused on providing 2.5-dimensional (2.5D) or 3-dimensional (3D) SIPs. Each of the 2.5-dimensional (2.5D) or 3-dimensional (3D) SIPs include at least one micro-processor chip and at least one memory chip, to improve functions of the semiconductor packages.

SUMMARY

According to an embodiment, a semiconductor package may include a first semiconductor chip, a second semiconductor chip disposed to overlap with a portion of the first semiconductor chip and connected to the first semiconductor chip through first coupling structures. The semiconductor package may include an interposer disposed to overlap with another portion of the first semiconductor chip and connected to the first semiconductor chip through second coupling structures. A first surface of the interposer may face the first semiconductor chip, and the interposer may include second internal interconnectors extending from the second coupling structures on the first surface to a second surface of the interposer opposite to the first surface. External interconnectors may be disposed on the second surface of the interposer and may be connected to the second internal interconnectors.

At least one of the external interconnectors extends onto a first surface of the second semiconductor chip opposite to a second surface of the second semiconductor chip facing the first semiconductor chip. The interposer and the second semiconductor chip are disposed side-by-side on the first semiconductor chip. The semiconductor package further comprises a dielectric layer configured to fill a gap between the interposer and the second semiconductor chip and expose the second surface of the interposer and the first surface of the second semiconductor chip. At least one of the external interconnectors extends onto a surface of the dielectric layer adjacent to the second surface of the interposer. The second surface of the interposer is substantially coplanar with the first surface of the second semiconductor chip. A surface of the dielectric layer is substantially coplanar with the second surface of the interposer and the first surface of the second semiconductor chip and the surface of the dielectric layer connects the second surface of the interposer to the first surface of the second semiconductor chip. Some of the second coupling structures and some of the internal interconnectors provide first electrical paths electrically connecting the first semiconductor chip to some of the external interconnectors. The others of the second coupling structures, the others of the internal interconnectors and some of the first coupling structures provide second electrical paths electrically connecting the second semiconductor chip to some of the external interconnectors through the first semiconductor chip. The semiconductor package further comprises first internal interconnectors electrically connecting others of the second coupling structures to some of the first coupling structures. Each of the internal interconnectors includes a through silicon via (TSV) that substantially penetrates the interposer. The others of the first coupling structures provide third electrical paths electrically connecting the second semiconductor chip to the first semiconductor chip. The second semiconductor chip overlaps with a central portion of the first semiconductor chip and the interposer includes a first interposer and a second interposer, the first and second interposers overlapping with both edges of the first semiconductor chip, respectively. The semiconductor package further comprises a heat spreader disposed on a first surface of the first semiconductor chip opposite to a second surface of the first semiconductor chip facing the second semiconductor chip and the second surface of the first semiconductor chip faces the second semiconductor chip and the interposer. The semiconductor package further comprises first external connectors attached to the external interconnectors, respectively. The semiconductor package further comprises a package substrate having second external connectors configured for electrically connecting to the first external connectors and a protection layer configured to cover the first and second semiconductor chips mounted on the package substrate. The first semiconductor chip is a system on chip (SoC) including an application processor, a microprocessor, a microcontroller, a digital signal processing core, or an interface. The second semiconductor chip includes a memory chip. The second semiconductor chip includes a high bandwidth memory (HBM) chip in which a plurality of memory chips having through silicon vias (TSVs) are stacked. The first and second semiconductor chips have different sizes, and a width of the second semiconductor chip is less than a width of the first semiconductor chip. The first coupling structures includes a first group of first connectors disposed on a surface of the first semiconductor chip, and second connectors disposed on a surface of the second semiconductor chip and respectively combined with the first group of first connectors, and the second coupling structures includes a second group of first connectors disposed on a surface of the first semiconductor chip, and third connectors disposed on a surface of the interposer and respectively combined with the second group of first connectors. The semiconductor package further comprises first external connectors attached to the external interconnectors, respectively, and the first external connectors are arrayed to have a pitch greater than a pitch of the first connectors, the pitch of the first external connectors are greater than a pitch of the second connectors, and the pitch of the first external connectors are greater than a pitch of the third connectors. The pitch of the first external connectors is 40 micrometers to 400 micrometers and the pitch of the first connectors, the second connectors, and the third connectors are each 10 to 100 micrometers depending on the pitch of the first external connectors. The semiconductor package further comprises first external connectors attached to the external interconnectors, respectively, and a width of the first external connectors is greater than a width of the first connectors and the width of the first external connectors is greater than a width of the second connectors, and the width of the first external connectors is greater than a width of the third connectors.

According to an embodiment, a semiconductor package may include a first semiconductor chip, a second semiconductor chip, an interposer, and external interconnectors. The first semiconductor chip may include a first group of first connectors, a second group of first connectors, a third group of first connectors, and a fourth group of first connectors disposed on a surface of the first semiconductor chip. The first semiconductor chip further may include first internal interconnectors that connect the first group of first connectors to the second group of first connectors. The second semiconductor chip may overlap with a portion of the first semiconductor chip and may include a first group of second connectors and a second group of second connectors disposed on a surface of the second semiconductor chip. The first group of second connectors may be respectively combined with the second group of first connectors, and the second group of second connectors may be respectively combined with the third group of first connectors. The interposer may overlap with another portion of the first semiconductor chip and may include a first group of third connectors respectively combined with the first group of first connectors and a second group of third connectors respectively combined with the fourth group of first connectors. The first group of third connectors and the second group of third connectors may be disposed on a first surface of the interposer, and the interposer may include second internal interconnectors extending from the third connectors to a second surface of the interposer opposite to the first surface. External interconnectors may be disposed on the second surface of the interposer and may be connected to the second internal interconnectors.

At least one of the external interconnectors extends onto a first surface of the second semiconductor chip opposite to a second surface of the second semiconductor chip facing the first semiconductor chip. The interposer and the second semiconductor chip are disposed side-by-side on the first semiconductor chip. The semiconductor package further comprises a dielectric layer configured to fill a gap between the interposer and the second semiconductor chip and expose the second surface of the interposer and the first surface of the second semiconductor chip. At least one of the external interconnectors extends onto a surface of the dielectric layer adjacent to the second surface of the interposer. The second surface of the interposer is substantially coplanar with the first surface of the second semiconductor chip. A surface of the dielectric layer is substantially coplanar with the second surface of the interposer and the first surface of the second semiconductor chip and the surface of the dielectric layer connects the second surface of the interposer to the first surface of the second semiconductor chip. The fourth group of first connectors, the second group of third connectors, and some of the internal interconnectors provide first electrical paths electrically connecting the first semiconductor chip to some of the external interconnectors. The second group of first connectors, the first group of second connectors, the first group of first connectors, the first group of third connectors, and the others of the internal interconnectors provide second electrical paths electrically connecting the second semiconductor chip to some of the external interconnectors through the first semiconductor chip. The semiconductor package further comprises first internal interconnectors electrically connecting the second group of first connectors to the first group of first connectors. Each of the internal interconnectors includes a through silicon via (TSV) that substantially penetrates the interposer. The third group of first connectors and the second group of second connectors provide third electrical paths electrically connecting the second semiconductor chip to the first semiconductor chip. The second semiconductor chip overlaps with a central portion of the first semiconductor chip, and the interposer includes a first interposer and a second interposer, the first and second interposers overlapping with both edges of the first semiconductor chip, respectively. The first group of third connectors are disposed on the first interposer and the second group of third connectors are disposed on the second interposer. The semiconductor package further comprises a heat spreader disposed on a first surface of the first semiconductor chip opposite to a second surface of the first semiconductor chip facing the second semiconductor chip, and the second surface of the first semiconductor chip faces the second semiconductor chip and the interposer. The semiconductor package further comprises first external connectors attached to the external interconnectors, respectively. The first external connectors are arrayed to have a pitch greater than a pitch of the first connectors. The pitch of the first external connectors is 40 micrometers to 400 micrometers and the pitch of the first connectors is 10 to 100 micrometers depending on the pitch of the first external connectors. A width of the first external connectors is greater than a width of the first connectors. The semiconductor package further comprises a package substrate having second external connectors configured for electrically connecting to the first external connectors, and a protection layer configured to cover the first and second semiconductor chips mounted on the package substrate. The first semiconductor chip is a system on chip (SoC) including an application processor, a microprocessor, a microcontroller, a digital signal processing core, or an interface. The second semiconductor chip includes a memory chip. The second semiconductor chip includes a high bandwidth memory (HBM) chip in which a plurality of memory chips having through silicon vias (TSVs) are stacked.

According to an embodiment, a semiconductor package may include a first semiconductor chip, a second semiconductor chip electrically connected to a portion of the first semiconductor chip, and an interposer including second internal interconnectors electrically connected to another portion of the first semiconductor chip. The semiconductor package may include a dielectric layer filling a gap between the second semiconductor chip and the interposer and exposing a surface of the second semiconductor chip opposite to the first semiconductor chip and a surface of the interposer opposite to the first semiconductor chip. The semiconductor package may include external interconnectors disposed on the surfaces of the second semiconductor chip and the interposer opposite to the first semiconductor chip and disposed on a surface of the dielectric layer. The external interconnectors may be connected to the second internal interconnectors. The surfaces of the second semiconductor chip and the interposer opposite to the first semiconductor chip are substantially coplanar with the surface of the dielectric layer.

According to an embodiment, there may be provided a method of manufacturing a semiconductor package. The method may include providing a wafer in which first semiconductor chips may be formed, disposing second semiconductor chips on the first semiconductor chips to connect each of the second semiconductor chips to one portion of any one of the first semiconductor chips using first coupling structures, and disposing interposers on the first semiconductor chips to connect each of the interposers to another portion of any one of the first semiconductor chips using second coupling structures. Each of the interposers may include second internal interconnectors extending from the second coupling structures on a first surface of the interposer into a body of the interposer. A thickness of the interposers and a thickness of the second semiconductor chips may be reduced to expose ends of the second internal interconnectors. External interconnectors may be formed on a second surface of each interposer where the ends of the second internal interconnectors may be exposed. The method further comprises forming a dielectric layer that covers the interposers and the second semiconductor chips. The step of reducing the thicknesses of the interposers and the second semiconductor chips includes planarizing the dielectric layer using a recess process, a polishing process or an etch-back process. At least one of the external interconnectors is formed to extend onto a surface of the dielectric layer adjacent to the second surface of the interposer. At least one of the external interconnectors is formed to extend onto a surface of the second semiconductor chip adjacent to the second surface of the interposer. The method further comprises separating the wafer into a plurality of semiconductor packages after the external interconnectors are formed, and each of the semiconductor packages includes any one of the first semiconductor chips.

According to an embodiment, there may be provided a method of manufacturing a semiconductor package. The method may include providing a wafer in which first semiconductor chips may be formed. A first group of first connectors, a second group of first connectors, a third group of first connectors, and a fourth group of first connectors may be formed on a surface of each of the first semiconductor chips. Second semiconductor chips may be mounted on the wafer so that each of the second semiconductor chips may overlap with one portion of any one of the first semiconductor chips. While the second semiconductor chips may be mounted on the wafer, the second group of first connectors may be combined with a first group of second connectors of the second semiconductor chips and the third group of first connectors may be combined with a second group of second connectors of the second semiconductor chips. Interposers may be mounted on the wafer so that each of the interposers may overlap with another portion of any one of the first semiconductor chips. While the interposers may be mounted on the wafer, the first group of first connectors may be combined with a first group of third connectors of the interposers and the fourth group of first connectors may be combined with a second group of third connectors of the interposers. Each of the interposer may include second internal interconnectors extending from the third connectors on a first surface of the interposer into a body of the interposer. A thickness of the interposers and a thickness of the second semiconductor chips may be reduced to expose ends of the second internal interconnectors. External interconnectors may be formed on a second surface of each interposer where the ends of the second internal interconnectors may be exposed. The method further comprises forming first internal interconnectors on the wafer, and the first internal interconnectors electrically connect the first group of first connectors to the second group of first connectors. The method further comprises forming a dielectric layer that covers the interposers and the second semiconductor chips. The step of reducing the thicknesses of the interposers and the second semiconductor chips includes planarizing the dielectric layer using a recess process, a polishing process or an etch-back process. At least one of the external interconnectors is formed to extend onto a surface of the dielectric layer adjacent to the second surface of the interposer. At least one of the external interconnectors is formed to extend onto a surface of the second semiconductor chip adjacent to the second surface of the interposer. The method further comprises separating the wafer into a plurality of semiconductor packages after the external interconnectors are formed, and each of the semiconductor packages includes any one of the first semiconductor chips.

According to an embodiment, there may be provided an electronic system including a package. The package may include a first semiconductor chip, a second semiconductor chip disposed to overlap with a portion of the first semiconductor chip and connected to the first semiconductor chip through first coupling structures, and an interposer disposed to overlap with another portion of the first semiconductor chip and connected to the first semiconductor chip through second coupling structures. A first surface of the interposer may face the first semiconductor chip, and the interposer may include second internal interconnectors extending from the second coupling structures on the first surface to a second surface of the interposer opposite to the first surface. External interconnectors may be disposed on the second surface of the interposer and may be connected to the second internal interconnectors.

According to an embodiment, there may be provided an electronic system including a package. The package may include a first semiconductor chip, a second semiconductor chip, an interposer, and external interconnectors. The first semiconductor chip may include a first group of first connectors, a second group of first connectors, a third group of first connectors, and a fourth group of first connectors disposed on a surface of the first semiconductor chip. The first semiconductor chip further may include first internal interconnectors connecting the first group of first connectors to the second group of first connectors. The second semiconductor chip may overlap with a portion of the first semiconductor chip and may include a first group of second connectors and a second group of second connectors disposed on a surface of the second semiconductor chip. The first group of second connectors may be respectively combined with the second group of first connectors, and the second group of second connectors may be respectively combined with the third group of first connectors. The interposer may overlap with another portion of the first semiconductor chip and may include a first group of third connectors respectively combined with the first group of first connectors and a second group of third connectors respectively combined with the fourth group of first connectors. The first group of third connectors and the second group of third connectors may be disposed on a first surface of the interposer. The interposer may include second internal interconnectors extending from the third connectors to a second surface of the interposer opposite to the first surface. External interconnectors may be disposed on the second surface of the interposer and may be connected to the second internal interconnectors.

According to an embodiment, there may be provided an electronic system including a package. The package may include a first semiconductor chip, a second semiconductor chip disposed to be electrically connected to a portion of the first semiconductor chip, an interposer including second internal interconnectors electrically connected to another portion of the first semiconductor chip. The package may include a dielectric layer filling a gap between the second semiconductor chip and the interposer and exposing a surface of the second semiconductor chip opposite to the first semiconductor chip and a surface of the interposer opposite to the first semiconductor chip. The package may include external interconnectors disposed on the surfaces of the second semiconductor chip and the interposer may be opposite to the first semiconductor chip and on a surface of the dielectric layer. The external interconnectors may be connected to the second internal interconnectors.

DETAILED DESCRIPTION

Figure 1:
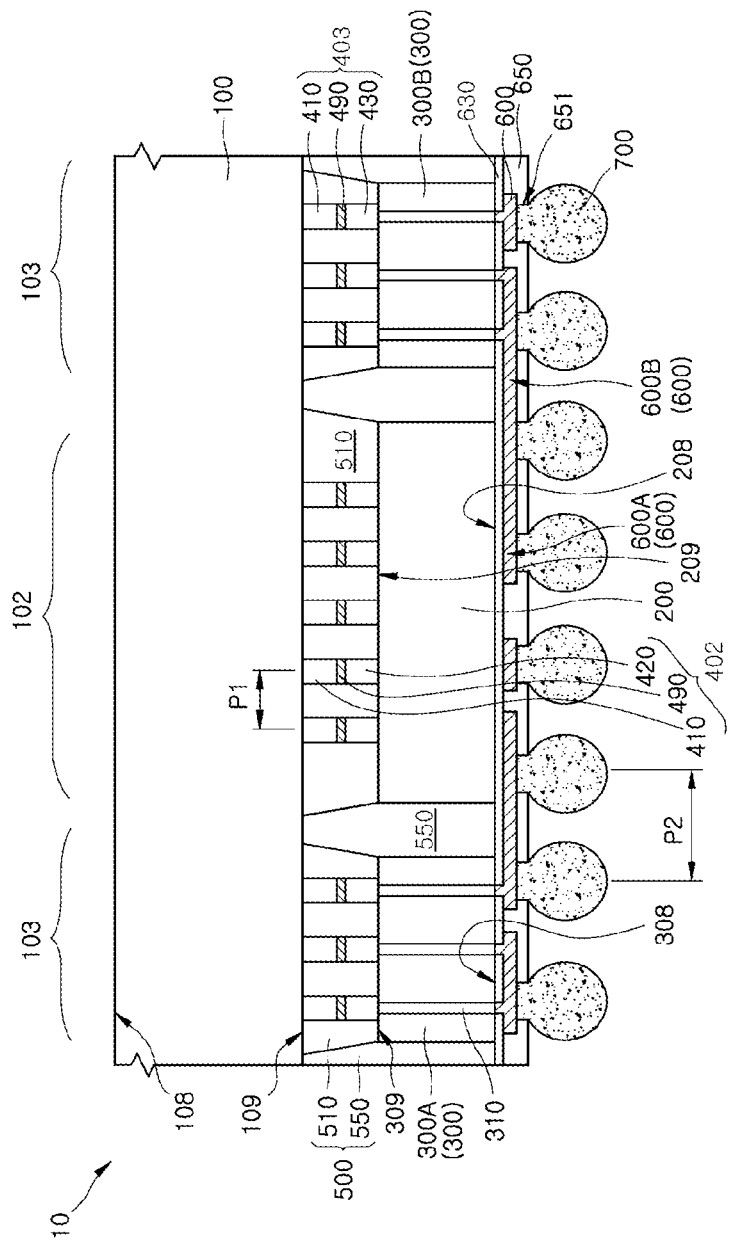
FIG. 1 is a cross-sectional view illustrating a representation of an example of a semiconductor package according to an embodiment.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the concepts or embodiments.

It will also be understood that when an element is referred to as being "on," "above," "below," "under," "aside," "in," or "inside" another element, it can be directly "on," "above," "below," "under," "aside," "in," or "inside" the other element, respectively, or intervening elements may also be present. Accordingly, the terms such as "on," "above," "below," "under," "aside," "in," "inside" which are used herein are for the purpose of describing particular embodiments only and are not intended to limit the concepts or embodiments.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion.

Various embodiments may generally be directed to semiconductor packages with interposers and methods of manufacturing the same.

In the following embodiments, semiconductor chips may be obtained by separating a semiconductor substrate such as a wafer into a plurality of dices using a die sawing process. In some cases, each of the semiconductor chips may include a semiconductor die mounted on a package substrate or a plurality of semiconductor dice stacked on a package substrate. If a plurality of semiconductor dice are stacked on a package substrate to form a semiconductor package, the plurality of semiconductor dice may be electrically connected to each other by through electrodes (or through vias) such as through silicon vias (TSVs). The semiconductor chips may correspond to memory chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate.

In some embodiments, the semiconductor chip may corresponds to a logic chip, for example, a system on chip (SoC) having various functions. The SoC may include a microprocessor, a microcontroller, a digital signal processing core or an interface. The microprocessor may include a central processing unit (CPU) or a graphics processing unit (GPU). The semiconductor chip may be a high bandwidth memory (HBM).

In high performance computing system, a bottleneck phenomenon may occur in memory devices. Accordingly, next generation high performance DRAM devices such as HBM may be employed as the semiconductor memory devices. The HBM may correspond to a memory standard including a plurality of memory dice which are stacked using a TSV technique to obtain a high bandwidth thereof. The HBM may have a lot of input/output (I/O) pins, for example, 1024 I/O pins to broaden the memory bandwidth. Thus, an interposer may be employed in a SIP to realize the number of signal lines corresponding to the increased I/O pins.

The SIP may require a lot of interconnection lines to electrically connect a plurality of semiconductor chips to each other. Accordingly, the SIP may employ an interposer to increase the number of interconnection lines disposed in a limited area. The interposer may be fabricated using processes for forming semiconductor dice. Thus, interconnection lines of the interposer may be formed to have a fine pitch or a fine width. The width of the interconnection lines of the interposer may be less than one micrometer. Therefore, the interposer may have advantages in increasing the number of the interconnection lines disposed in a limited area. In addition, the interposer may include through electrodes (or through vias) such as TSVs that electrically connect lower interconnection lines disposed on a bottom surface of the interposer to upper interconnection lines disposed on a top surface of the interposer. Interconnection lines of the interposer may be formed to have a fine pitch. The pitch of the interconnection lines of the interposer may be less than a pitch of interconnection lines of a general package substrate such as a printed circuit board (PCB). For example, silicon interposers fabricated using a silicon wafer may be employed in the SIPs.

Figure 2:
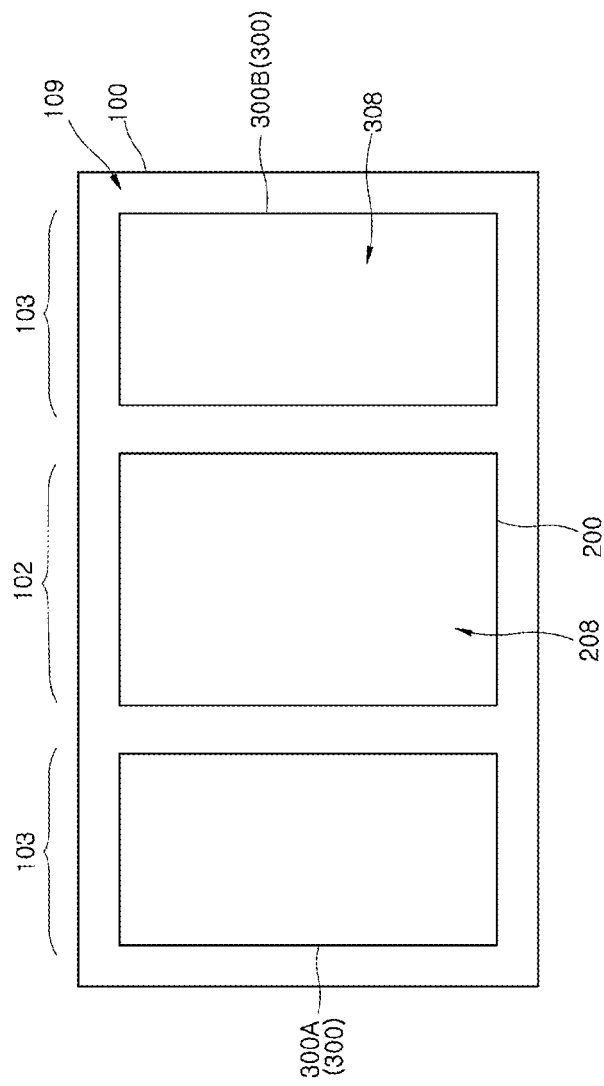
FIG. 2 is a layout diagram illustrating a representation of an example of a semiconductor package according to an embodiment.

FIG. 1 is a cross-sectional view illustrating a representation of an example of a semiconductor package 10 according to an embodiment, and FIG. 2 illustrates a representation of an example of a layout diagram of the semiconductor package 10.

Referring to FIGS. 1 and 2, the semiconductor package 10 may include a first semiconductor chip 100, a second semiconductor chip 200 stacked on a surface of the first semiconductor chip 100, and an interposer 300 electrically and physically connecting the first semiconductor chip 100 to the second semiconductor chip 200. The second semiconductor chip 200 may be mounted on the first semiconductor chip 100 to overlap with a portion of the first semiconductor chip 100, for example, a first region 102 of the first semiconductor chip 100. In an embodiment, the first region 102 of the first semiconductor chip 100 may correspond to a central portion of the first semiconductor chip 100. The interposer 300 may be mounted on the first semiconductor chip 100 to overlap another portion of the first semiconductor chip 100, for example, a second region 103 of the first semiconductor chip 100. In an embodiment, the second region 103 of the first semiconductor chip 100 may include both edges of the first semiconductor chip 100. The second semiconductor chip 200 and the interposer 300 may be disposed side-by-side on a surface of the first semiconductor chip 100. The interposer 300 may include a first interposer 300A and a second interposer 300B respectively disposed on both edges constituting the second region 103 of the first semiconductor chip 100. That is, the first interposer 300A and the second interposer 300B may be disposed at both sides of the second semiconductor chip 200, respectively. The first interposer 300A and the second interposer 300B may be disposed to be spaced apart from each other. Although FIG. 2 illustrates an example in which the first interposer 300A and the second interposer 300B are separated from each other, the present disclosure is not limited thereto. For example, in some embodiments, the second semiconductor chip 200 may be disposed between the first and second interposers 300A and 300B, and the first and second interposers 300A and 300B may be physically connected to each other to constitute the interposer 300 surrounding the second semiconductor chip 200 in a plan view.

The first and second semiconductor chips 100 and 200 may have different sizes. For example, a width of the second semiconductor chip 200 may be less than a width of the first semiconductor chip 100. The first semiconductor chip 100 may be a semiconductor die in which integrated circuits are realized or may be provided in a single package form including the semiconductor die and a molding member encapsulating the semiconductor die. The second semiconductor chip 200 may also be a semiconductor die in which integrated circuits are realized or may be provided in a single package form including the semiconductor die and a molding member encapsulating the semiconductor die. The first and second semiconductor chips 100 and 200 may be provided to have different functions.

The first semiconductor chip 100 may include a logic chip provided in an SoC package form. The first semiconductor chip 100 may include a semiconductor die in which an application processor, a microprocessor such as a CPU or a GPU, a microcontroller, a digital signal processing core, or an interface is integrated or may include a semiconductor package including a semiconductor die encapsulated by a molding member. The second semiconductor chip 200 may be a memory device such as a DRAM device. The second semiconductor chip 200 may be a memory chip that has a HBM scheme. The second semiconductor chip 200 may communicate with the first semiconductor chip 100. The second semiconductor chip 200 may be a HBM chip.

In the event that the semiconductor package 10 requires a large capacity of memory, the semiconductor package 10 may has a multiple number of the second semiconductor chip 200. As an operation of a processor included in the first semiconductor chip 100 requires a large capacity of memory, the second semiconductor chip 200 may be configured to include a highly integrated memory chip or a plurality of second semiconductor chips 200 and the plurality of second semiconductor chips 200 may be electrically connected to the first semiconductor chip 100. The plurality of second semiconductor chips 200 may be one dimensionally or two dimensionally arrayed on the first semiconductor chip 100. In some embodiments, the second semiconductor chips 200 may include a plurality of chips having different functions or different sizes. Alternatively, the second semiconductor chips 200 may include a plurality of chips having the same function and the same size.

Although FIG. 1 illustrates an example in which the second semiconductor chip 200 is disposed on the first region 102 of the first semiconductor chip 100, the present disclosure is not limited thereto. For example, in some other embodiments, a plurality of second semiconductor chips 200 may be disposed on the second regions 103 of the first semiconductor chip 100 and the interposer 300 may be disposed on the first region 102 of the first semiconductor chip 100. The first semiconductor chip 100 may have a fifth surface 109 (i.e., the second surface of the first semiconductor chip 100) and a sixth surface 108 (i.e., the first surface of the first semiconductor chip 100) that are opposite to each other, and the second semiconductor chip 200 may have a third surface 209 (i.e., the second surface of the second semiconductor chip 200) and a fourth surface 208 (i.e., the first surface of the second semiconductor chip 200) that are opposite to each other. The second semiconductor chip 200 may be mounted on the first semiconductor chip 100 so that the third surface 209 of the second semiconductor chip 200 faces the fifth surface 109 of the first semiconductor chip 100.

First connectors 410 may be disposed on the fifth surface 109 of the first semiconductor chip 100. The first connectors 410 may be micro bumps. Second connectors 420 may be disposed on the third surface 209 of the second semiconductor chip 200. The second connectors 420 may be micro bumps. The second connectors 420 may be respectively combined with the first connectors 410 on the first region 102, and the first and second connectors 410 and 420 combined with each other may constitute first coupling structures 402 that electrically and physically connect the second semiconductor chip 200 to the first semiconductor chip 100. Each of the first connectors 410 may be electrically and physically combined with any one of the second connectors 420 through a conductive interconnector 490. The first connectors 410 and the second connectors 420 may be combined with each other to provide bump connection structures. Accordingly, the first coupling structures 402 having the bump connection structures may reduce a length of electrical paths between the first and second semiconductor chips 100 and 200. Since the second semiconductor chip 200 is disposed to overlap with the first semiconductor chip 100, the electrical connection paths between the first and second semiconductor chips 100 and 200 may be realized to be shorter. Thus, a signal transmission speed between the first and second semiconductor chips 100 and 200 may become faster, and a data transmission rate between the first and second semiconductor chips 100 and 200 may also increase.

The first connectors 410 on the second regions 103 of the first semiconductor chip 100 may be combined with third connectors 430 of the interposer 300, respectively. The third connectors 430 may be disposed on a first surface 309 of the interposer 300 and may be combined with the first connectors 410 on the second regions 103 of the first semiconductor chip 100. The third connectors 430 may be conductive connection members such as micro bumps. The third connectors 430 and the first connectors 410 combined with the third connectors 430 may constitute second coupling structures 403 that electrically and physically connect the interposer 300 to the first semiconductor chip 100. Each of the third connectors 430 may be electrically and physically combined with any one of the first connectors 410 through the conductive interconnector 490. The third connectors 430 and the first connectors 410 may be combined with each other to provide bump connection structures. Accordingly, the second coupling structures 403 having the bump connection structures may reduce a length of electrical paths between the first semiconductor chip 100 and the interposer 300. Since the interposer 300 is disposed to overlap with the first semiconductor chip 100, the electrical connection paths between the first semiconductor chip 100 and the interposer 300 may be realized to be shorter. Thus, a signal transmission speed between the first semiconductor chip 100 and the interposer 300 may become faster, and a data transmission rate between the first semiconductor chip 100 and the interposer 300 may also increase.

Each of the first, second and third connectors 410, 420 and 430 may have a size of several micrometers to several tens of micrometers. For example, each of the first, second and third connectors 410, 420 and 430 may have a diameter less than 100 micrometers. The first, second and third connectors 410, 420 and 430 may be arrayed to have a first pitch P1 of about 10 micrometers to about 100 micrometers.

The interposer 300 may be disposed to overlap with the first semiconductor chip 100 so that the first surface 309 of the interposer 300 faces the fifth surface 109 of the first semiconductor chip 100. The interposer 300 may include second internal interconnectors 310 (i.e., internal interconnectors) extending from the second coupling structures 403. The second internal interconnectors 310 may extend from the first surface 309 of the interposer 300 to a second surface 308 of the interposer 300 opposite to the first surface 309. The second internal interconnectors 310 may be through vias, for example, through silicon vias (TSVs) that substantially penetrate a body of the interposer 300. The interposer 300 may include a silicon interposer fabricated using a silicon substrate. Since the second internal interconnectors 310 include the through vias, lengths of electrical signal paths of the semiconductor package 10 may be reduced.

The semiconductor package 10 may further include an underfill layer 510 surrounding sidewalls of the first coupling structures 402 and sidewalls of the second coupling structures 403. A dielectric layer 550 may fill gaps between the second semiconductor chip 200 and the interposer 300. The dielectric layer 550 and the underfill layer 510 may constitute a first protection layer 500. The dielectric layer 550 may be, for example, an epoxy resin layer containing an epoxy component such as an epoxy molding compound (EMC) material or may be a layer containing a rubber component such as a polymer material or a silicone rubber material. The dielectric layer 550 may be disposed to expose the second surface 308 of the interposer 300 opposite to the first semiconductor chip 100 and the fourth surface 208 of the second semiconductor chip 200 opposite to the first semiconductor chip 100. In some embodiments, the underfill layer 510 and the dielectric layer 550 may be comprised of the same material. For example, the first protection layer 500 including the underfill layer 510 and the dielectric layer 550 may be comprised of an EMC material.

External interconnectors 600 may be disposed on the second surface 308 of the interposer 300 and the fourth surface 208 of the second semiconductor chip 200. The external interconnectors 600 may include a plurality of redistributed lines disposed on the second surface 308 of the interposer 300 and the fourth surface 208 of the second semiconductor chip 200. Some of the redistributed lines may extend onto a surface of the dielectric layer 550. Each of the external interconnectors 600 may be combined with at least one of the second internal interconnectors 310 to be electrically connected to the first semiconductor chip 100. The external interconnectors 600 may also be electrically connected to the second semiconductor chip 200 through the first semiconductor chip 100. An insulation layer 630 may be disposed between the second surface 308 of the interposer 300 and the external interconnectors 600 to electrically insulate the external interconnectors 600 from the interposer 300. The insulation layer 630 may also be disposed between the fourth surface 208 of the second semiconductor chip 200 and the external interconnectors 600 to electrically insulate the external interconnectors 600 from the second semiconductor chip 200. Ends of the external interconnectors 600 may penetrate the insulation layer 630 to contact the second internal interconnectors 310. The insulation layer 630 may extend to cover the surface of the dielectric layer 550 between the second semiconductor chip 200 and the interposer 300. The insulation layer 630 may be a dielectric layer.

Each of the external interconnectors 600 may include at least one external contact portion 600A to which a first external connector 700 may be attached. The first external connector 700 may be combined with or connected to an external electronic system, an external PCB or an external module board. Each of the external interconnectors 600 may further include an external extension 600B that corresponds to a trace pattern acting as a circuit interconnection line. That is, the external extension 600B may extend from the external extension 600B to electrically connect the external extension 600B to any one of the second internal interconnectors 310. Some of the external interconnectors 600 may extend onto the fourth surface 208 of the second semiconductor chip 200, or the external interconnectors 600 may include some patterns that are disposed on the fourth surface 208 of the second semiconductor chip 200. Some of the external interconnectors 600 may extend onto a surface of the dielectric layer 550, or the external interconnectors 600 may include some patterns that are disposed on the surface of the dielectric layer 550. The semiconductor package 10 may further include a second protection layer 650 disposed on the insulation layer 630 to cover the external interconnectors 600. The second protection layer 650 may have opening windows 651 exposing the external contact portions 600A and may cover the external extension 600B. The second protection layer 650 may include a dielectric material, for example, a solder resist material. As described above, the first external connectors 700 may be attached to the external contact portions 600A and may be electrically connected to an external electronic system or an external substrate. The first external connectors 700 may be arrayed to have a second pitch P2 greater than the first pitch P1 of the first connectors 410, the second connectors 420 or the third connectors 430. For example, the second pitch P2 may be within the range of about 40 micrometers to about 400 micrometers. Each of the first external connectors 700 may be a bump or a solder ball having a width which is greater than a width of each of the first connectors 410, the second connectors 420 and the third connectors 430.

Figure 3:
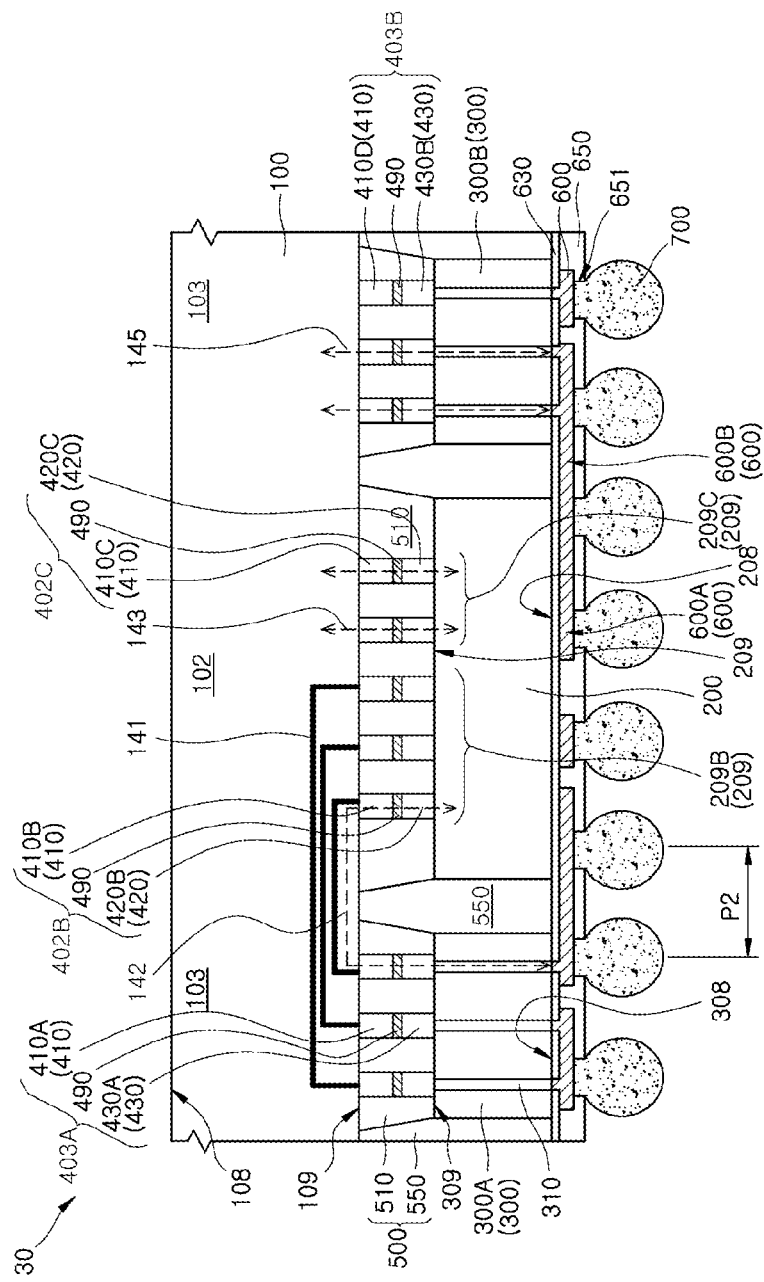
FIG. 3 is a cross-sectional view illustrating a representation of an example of a semiconductor package according to an embodiment.
Figure 4:
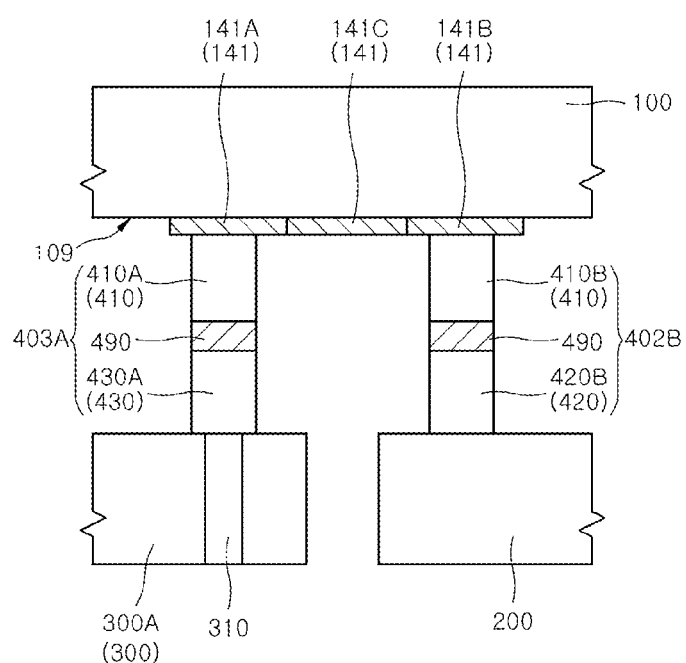
FIG. 4 is a cross-sectional view illustrating a representation of an example of an interconnection structure employed in a semiconductor package according to an embodiment.
Figure 5:
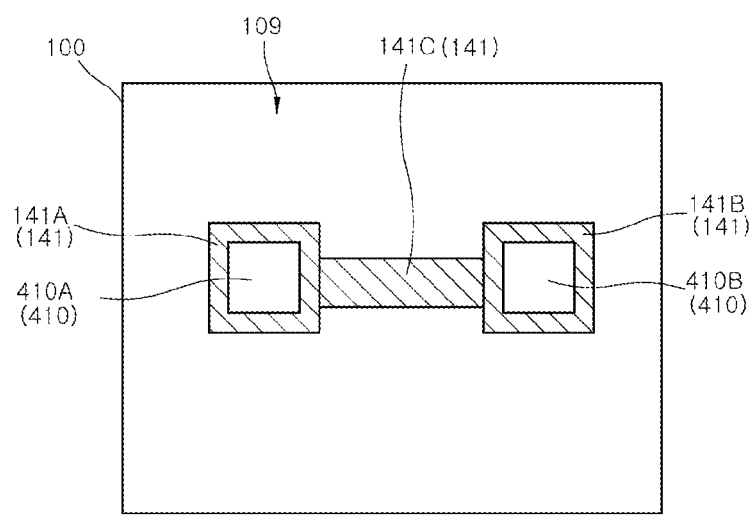
FIG. 5 is a plan view illustrating a representation of an example of an interconnection structure of a semiconductor package according to an embodiment.

FIG. 3 is a cross-sectional view illustrating a representation of an example of a semiconductor package 30 according to an embodiment. FIG. 4 is a cross-sectional view illustrating a representation of an example of an interconnection structure employed in a semiconductor package according to an embodiment, and FIG. 5 is a plan view illustrating a representation of an example of an interconnection structure of a semiconductor package according to an embodiment. In FIGS. 3, 4 and 5, the same reference numerals as used in FIGS. 1 and 2 denote the same elements.

Referring to FIG. 3, the semiconductor package 30 may include the first semiconductor chip 100 having the fifth surface 109 on which the first connectors 410 disposed. The first semiconductor chip 100 may include the first region 102 and the second region 103. The first connectors 410 may be divided into a plurality of groups. For example, the first connectors 410 may include a first group of first connectors 410A disposed on a portion of the second region 103 of the first semiconductor chip 100, a second group of first connectors 410B disposed on a portion of the first region 102 of the first semiconductor chip 100, a third group of first connectors 410C disposed on the other portion of the first region 102 of the first semiconductor chip 100, and a fourth group of first connectors 410D disposed on the other portion of the second region 103 of the first semiconductor chip 100.

Some of the third connectors 430 disposed on the first surface 309 of the interposer 300, for example, a first group of third connectors 430A disposed on the first surface 309 of the first interposer 300A may be combined with the first group of first connectors 410A through conductive interconnectors 490. The first group of third connectors 430A, the first group of first connectors 410A combined with the first group of third connectors 430A, and the conductive interconnectors 490 between the first group of third connectors 430A and the first group of first connectors 410A may constitute a first group of second coupling structures 403A that electrically connect the first interposer 300A to the first semiconductor chip 100.

Some of the second connectors 420 disposed on the third surface 209 of the second semiconductor chip 200, for example, a first group of second connectors 420B may be combined with the second group of first connectors 410B through the conductive interconnectors 490. The first group of second connectors 420B, the second group of first connectors 410B combined with the first group of second connectors 420B, and the conductive interconnectors 490 between the first group of second connectors 420B and the second group of first connectors 410B may constitute a first group of first coupling structures 402B that electrically connect the second semiconductor chip 200 to the first semiconductor chip 100.

The others of the second connectors 420 disposed on the third surface 209 of the second semiconductor chip 200, for example, a second group of second connectors 420C may be combined with the third group of first connectors 410C through the conductive interconnectors 490. The second group of second connectors 420C, the third group of first connectors 410C combined with the second group of second connectors 420C, and the conductive interconnectors 490 between the second group of second connectors 420C and the third group of first connectors 410C may constitute a second group of first coupling structures 402C electrically connecting the second semiconductor chip 200 to the first semiconductor chip 100.

The others of the third connectors 430 disposed on the first surface 309 of the interposer 300, for example, a second group of third connectors 430B disposed on the first surface 309 of the second interposer 300B may be combined with the fourth group of first connectors 410D through the conductive interconnectors 490. The second group of third connectors 430B, the fourth group of first connectors 410D combined with the second group of third connectors 430B, and the conductive interconnectors 490 between the second group of third connectors 430B and the fourth group of first connectors 410D may constitute a second group of second coupling structures 403B electrically connecting the second interposer 300B to the first semiconductor chip 100.

The second group of second coupling structures 403B including the second group of third connectors 430B, the fourth group of first connectors 410D and the conductive interconnectors 490 may provide first electrical paths 145 electrically connecting the first semiconductor chip 100 to the second internal interconnectors 310 of the second interposer 300B. The first electrical paths 145 may also electrically connect the first semiconductor chip 100 to the external interconnectors 600 through the second internal interconnectors 310 of the second interposer 300B. Since the first electrical paths 145 directly connect the first semiconductor chip 100 to the second interposer 300B and electrically connect the first semiconductor chip 100 to the external interconnectors 600 disposed on the second surface 308 of the second interposer 300B, a length of electrical paths or signal paths between the first semiconductor chip 100 and the external interconnectors 600 may be reduced. Thus, a signal transmission speed between the first semiconductor chip 100 and an external electronic system (or an external substrate) connected to the external interconnectors 600 may become faster, and a data transmission rate between the first semiconductor chip 100 and the external electronic system (or the external substrate) may also increase.

The second group of first coupling structures 402C including the second group of second connectors 420C, the third group of first connectors 410C and the conductive interconnectors 490 may provide third electrical paths 143 electrically connecting the first semiconductor chip 100 to the second semiconductor chip 200. The third electrical paths 143 may directly connect the first semiconductor chip 100 to the second semiconductor chip 200 without any extra interconnection lines. Thus, a length of electrical paths or signal paths between the first semiconductor chip 100 and the second semiconductor chip 200 may be reduced. As a result, a signal transmission speed between the first semiconductor chip 100 and the second semiconductor chip 200 may become faster, and a data transmission rate between the first semiconductor chip 100 and the second semiconductor chip 200 may also increase.

The first group of second coupling structures 403A including the first group of third connectors 430A, the first group of first connectors 410A and the conductive interconnectors 490 may be electrically connected to the first group of first coupling structures 402B including the first group of second connectors 420B, the second group of first connectors 410B and the conductive interconnectors 490, through the first semiconductor chip 100. That is, the first group of second coupling structures 403A and the first group of first coupling structures 402B may provide second electrical paths 142 electrically connecting the second semiconductor chip 200 to some of the external interconnectors 600 through the first semiconductor chip 100 and the first interposer 300A. First internal interconnectors 141 may be disposed on the fifth surface 109 of the first semiconductor chip 100 to electrically connect the first group of second coupling structures 403A to the first group of first coupling structures 402B. As illustrated in FIGS. 4 and 5, each of the first internal interconnectors 141 may include a first internal contact portion 141A disposed on the fifth surface 109 of the first semiconductor chip 100, a second internal contact portion 141B disposed on the fifth surface 109 of the first semiconductor chip 100, and an internal extension 141C connecting the first internal contact portion 141A to the second internal contact portion 141B. Any one of the first group of first connectors 410A may be combined with the first internal contact portion 141A, and any one of the second group of first connectors 410B may be combined with the second internal contact portion 141B. Thus, the first internal interconnectors 141 may connect the first group of second coupling structures 403A to the first group of first coupling structures 402B.

Figure 6:
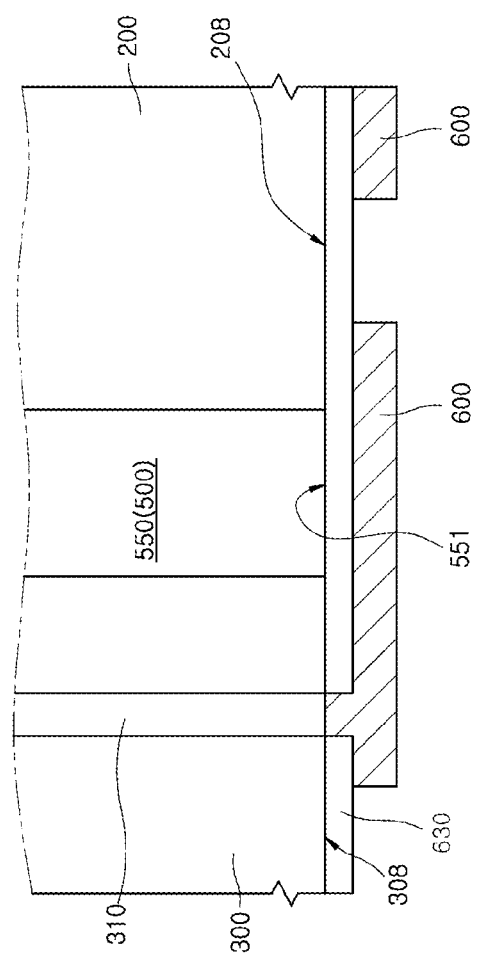
FIG. 6 is a cross-sectional view illustrating a representation of an example of an external connection structure of a semiconductor package according to an embodiment.

FIG. 6 is a cross-sectional view illustrating a representation of an example of an external connection structure of a semiconductor package according to an embodiment. In FIG. 6, the same reference numerals as used in FIGS. 1 and 2 denote the same elements.

Referring to FIG. 6, the external interconnector 600 disposed on the second surface 308 of the interposer 300 may extend onto the fourth surface 208 of the semiconductor chip 200 adjacent to the interposer 300. The semiconductor chip 200 and the interposer 300 may be disposed side-by-side on the first semiconductor chip 100, and the external interconnector 600 combined with an end of the second internal interconnector 310 in the interposer 300 may be a trace pattern that extends onto the fourth surface 208 of the semiconductor chip 200. The dielectric layer 550 may fill the gap between the semiconductor chip 200 and the interposer 300 and may expose the fourth surface 208 of the semiconductor chip 200 and the second surface 308 of the interposer 300. The external interconnector 600 may extend onto a surface 551 of the dielectric layer 550. The fourth surface 208 of the semiconductor chip 200 may be substantially coplanar with the second surface 308 of the interposer 300, and the surface 551 of the dielectric layer 550 may also be substantially coplanar with the fourth surface 208 of the semiconductor chip 200 and the second surface 308 of the interposer 300. Accordingly, a global surface provided by the surface 551 of the dielectric layer 550, the fourth surface 208 of the semiconductor chip 200 and the second surface 308 of the interposer 300 may be substantially flat without uneven profiles. As a result, the external interconnectors 600 may be provided to have a fine size. That is, the dielectric layer 550, the semiconductor chip 200 and the interposer 300 may provide a substantially flat or flat surface including the surface 551 of the dielectric layer 550, the fourth surface 208 of the semiconductor chip 200 and the second surface 308 of the interposer 300. Thus, the external interconnectors 600 disposed on the flat surface 551, 208 and 308 may be formed to have a fine pitch which is less than the second pitch P2. This is because pattern deformation or pattern distortion due to an uneven surface profile is suppressed during a lithography process for forming the external interconnectors 600. The insulation layer 630 may be disposed between the fourth surface 208 of the second semiconductor chip 200 and the external interconnectors 600 to electrically insulate the external interconnectors 600 from the second semiconductor chip 200.

Figure 7:
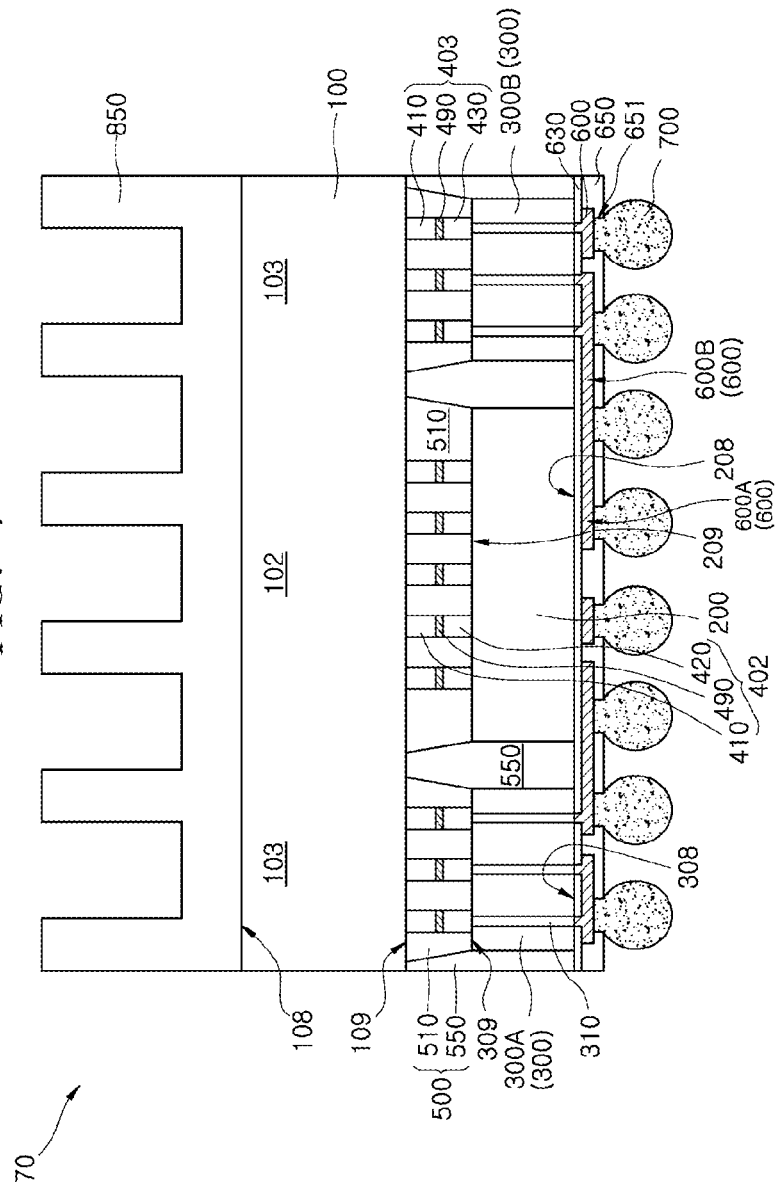
FIG. 7 is a cross-sectional view illustrating a representation of an example of a semiconductor package according to an embodiment.

FIG. 7 is a cross-sectional view illustrating a representation of an example of a semiconductor package 70 according to an embodiment. In FIG. 7, the same reference numerals as used in FIGS. 1 and 2 denote the same elements.

Referring to FIG. 7, the semiconductor package 70 may include the first semiconductor chip 100, the second semiconductor chip 200 stacked on the first semiconductor chip 100, and the interposer 300 stacked on the first semiconductor chip 100. The semiconductor package 70 may further include a heat spreader 850 disposed on the sixth surface 108 of the first semiconductor chip 100. The first semiconductor chip 100 may be an SoC including an application processor, a microprocessor, a controller or the like. Accordingly, the first semiconductor chip 100 may generate a lot of heat while the first semiconductor chip 100 executes various logical operations. The heat spreader 850 may be attached to the sixth surface 108 of the first semiconductor chip 100 to radiate the heat generated from the first semiconductor chip 100. In order to improve a heat radiation efficiency of the semiconductor package 70, a thermal interface material layer (not illustrated) may be disposed between the heat spreader 850 and the sixth surface 108 of the first semiconductor chip 100.

Figure 8:
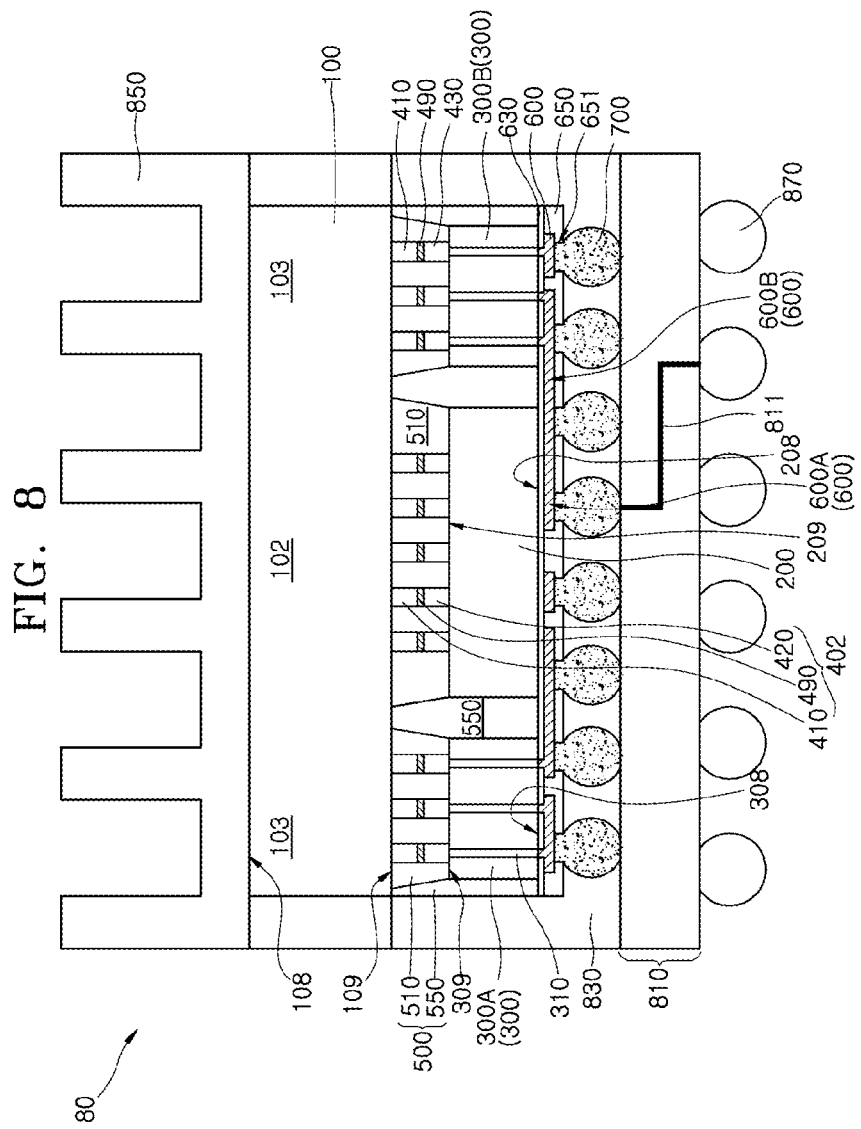
FIG. 8 is a cross-sectional view illustrating a representation of an example of a semiconductor package according to an embodiment.

FIG. 8 is a cross-sectional view illustrating a representation of an example of a semiconductor package 80 according to an embodiment. In FIG. 8, the same reference numerals as used in FIGS. 1 to 7 denote the same elements.

Referring to FIG. 8, the semiconductor package 80 may include the first semiconductor chip 100, the second semiconductor chip 200 stacked on the first semiconductor chip 100, and the interposer 300 stacked on the first semiconductor chip 100. The semiconductor package 80 may further include the external interconnectors 600 electrically connecting the first and second semiconductor chips 100 and 200 to an external electronic system or an external substrate. The semiconductor package 80 may further include a package substrate 810 having second external connectors 870 electrically connected to the first external connectors 700 attached to the external interconnectors 600. The package substrate 810 may include third internal interconnectors 811 electrically connecting the first external connectors 700 to the second external connectors 870. The third internal interconnectors 811 may be comprised of a multi-layered interconnection structure and a via connection structure disposed therein. The package substrate 810 may be a PCB. The second external connectors 870 may be arrayed to have a pitch greater than a pitch of the first external connectors 700 or may be disposed to have a width greater than a width of the first external connectors 700. The second external connectors 870 may be solder balls.

The first semiconductor chip 100, the second semiconductor chip 200 and the interposer 300 may be stacked on the package substrate 810. A third protection layer 830 may be disposed on a surface of the package substrate 810 to cover sidewalls of the first semiconductor chip 100, the second semiconductor chip 200 and the interposer 300 mounted on the package substrate 810. The third protection layer 830 may fill gaps between the first external connectors 700. The third protection layer 830 may include an insulation material such as an EMC material or a resin material.

The semiconductor package 80 may further include the heat spreader 850 disposed on the sixth surface 108 of the first semiconductor chip 100. The heat spreader 850 may extend to cover a surface of the third protection layer 830 adjacent to the sixth surface 108 of the first semiconductor chip 100. The first semiconductor chip 100 may be an SoC including an application processor, a microprocessor, a controller or the like. Accordingly, the first semiconductor chip 100 may generate a lot of heat while the first semiconductor chip 100 executes various logical operations. The heat spreader 850 may be attached to the sixth surface 108 of the first semiconductor chip 100 to radiate the heat generated from the first semiconductor chip 100. In order to improve a heat radiation efficiency of the semiconductor package 80, a thermal interface material layer (not illustrated) may be disposed between the heat spreader 850 and the sixth surface 108 of the first semiconductor chip 100.

Figure 9:
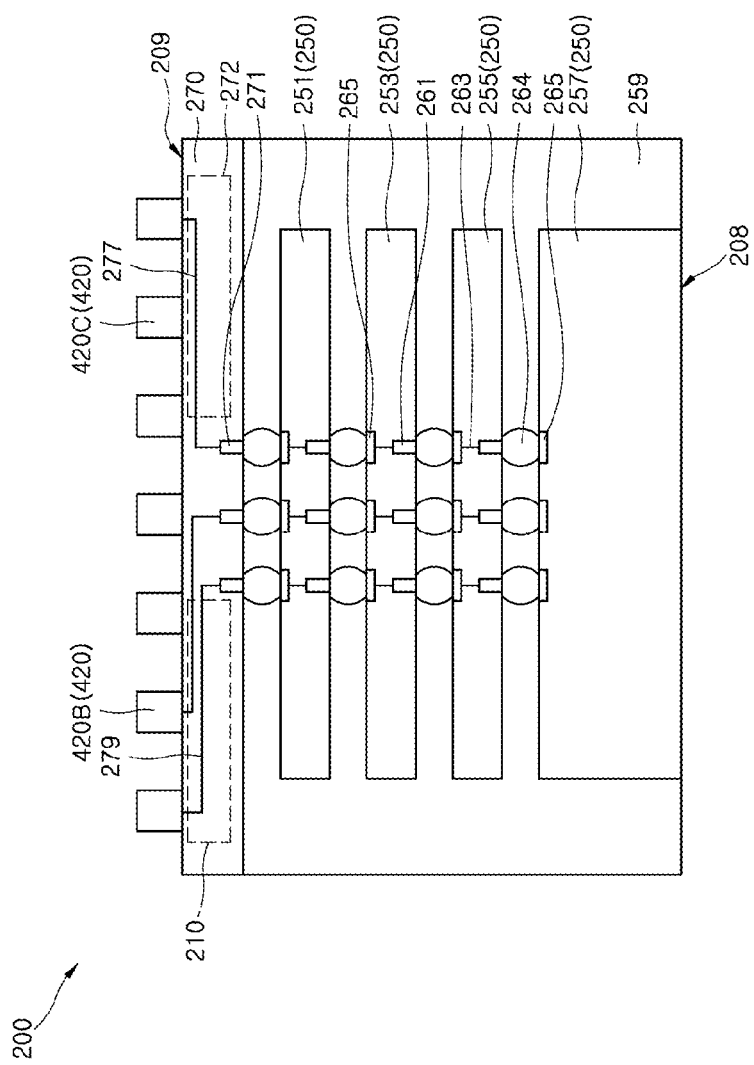
FIG. 9 is a cross-sectional view illustrating a representation of an example of a second semiconductor chip employed in a semiconductor package according to an embodiment.

FIG. 9 is a cross-sectional view illustrating a representation of an example of the second semiconductor chip 200 employed in a semiconductor package according to an embodiment.

Referring to FIGS. 3 and 9, the second semiconductor chip 200 mounted on the first semiconductor chip 100 may include a semiconductor die 250 encapsulated by a fourth protection layer 259. The semiconductor die 250 may include integrated circuits which are realized on a silicon wafer or a semiconductor substrate. The semiconductor die 250 may be a memory device such as a DRAM device. The second semiconductor chip 200 may be provided in a single package form encapsulated by the fourth protection layer 259 surrounding the semiconductor die 250, and the second connectors 420 may be attached to the third surface 209 of the second semiconductor chip 200.

The second semiconductor chip 200 may be comprised of a single semiconductor die 250. Alternatively, the second semiconductor chip 200 may include a plurality of semiconductor dice 250 to increase a memory capacity of the second semiconductor chip 200. For example, the semiconductor die 250 may be configured to include first to fourth semiconductor dices 251, 253, 255 and 257 which are vertically stacked. The first to fourth semiconductor dices 251, 253, 255 and 257 may have the same form and the same function or substantially the same form and the same function.

The fourth protection layer 259 may be disposed to cover sidewalls of a stack structure of the first to fourth semiconductor dices 251, 253, 255 and 257 and to expose a bottom surface of the fourth semiconductor die 257 corresponding to a lowermost die of the first to fourth semiconductor dice 251, 253, 255 and 257. The exposed bottom surface of the fourth semiconductor die 257 may correspond to the fourth surface 208 of the second semiconductor chip 200. The fourth protection layer 259 may include an EMC material or a silicone resin material. The fourth protection layer 259 may be formed using a molding process. In the event that the bottom surface (i.e., the fourth surface 208) of the fourth semiconductor die 257 is exposed, heat generated from the semiconductor die 250 may be readily radiated outside. A thickness of the fourth semiconductor die 257 may be greater than a thickness of the other semiconductor dice 251, 253 and 255 in order to protect the fourth semiconductor die 257 having the exposed bottom surface from a stress of an external environment. The first to third semiconductor dice 251, 253 and 255 may have substantially the same thickness, and each of the first to third semiconductor dice 251, 253 and 255 may be thinner than the fourth semiconductor die 257. As a result, a total thickness of the second semiconductor chip 200 may be reduced.

Interconnection structures including fourth internal interconnectors 261 such as TSVs may be provided in the first to fourth semiconductor dices 251, 253, 255 and 257 constituting the semiconductor die 250. Fifth internal interconnectors 263 may be provided in the first to fourth semiconductor dices 251, 253, 255 and 257 to electrically connect the fourth internal interconnectors 261 to third internal contact portions 265 disposed on surfaces of the first to fourth semiconductor dices 251, 253, 255 and 257 to act as landing pads. Conductive connectors 264 may be disposed between the first to fourth semiconductor dices 251, 253, 255 and 257 to electrically and mechanically connect the first to fourth semiconductor dices 251, 253, 255 and 257 to each other. The conductive connectors 264 may be micro bumps. Connection pads (not illustrated) may be additionally disposed on ends of the fourth internal interconnectors 261 and may be combined with the conductive connectors 264. No semiconductor die is stacked on a bottom surface of the fourth semiconductor die 257 corresponding to a lowermost semiconductor die among the first to fourth semiconductor dice 251. Thus, the fourth internal interconnectors 261 such as TSVs may not be disposed in the fourth semiconductor die 257.

The semiconductor die 250 may be stacked on a bottom surface of a base die 270. The base die 270 may be electrically connected to the semiconductor die 250 and may be provided to include a first interface 210 for data communication (or signal transmission) between the first semiconductor chip 100 and the second semiconductor chip 200 (or the semiconductor die 250). The first interface 210 may be configured to provide a function of a physical layer (a PHY region). The base die 270 may have a test function, a repair function for repairing failed memory cells of the semiconductor die 250, and a function for redistribution of the PHY region and I/O pads.

The base die 270 may be connected to the semiconductor die 250 by TSVs. For example, the base die 270 may include sixth internal interconnectors 271 such as TSVs that are electrically connected to the fourth internal interconnectors 261 of the semiconductor die 250 through the fifth internal interconnectors 263 and the conductive connectors 264. The sixth internal interconnectors 271 may be respectively connected to the fifth internal interconnectors 263 in the first semiconductor die 251 in a point-to-point manner. In addition, the fifth internal interconnectors 263 in the first semiconductor die 251 may also be respectively connected to the fourth internal interconnectors 261 in the first semiconductor die 251 in a point-to-point manner. For example, sixth internal interconnectors 271 may be disposed in a central portion of the base die 270 that overlaps with a central portion of the semiconductor die 250 in which the fourth and fifth internal interconnectors 261 and 263 are disposed.

The base die 270 may further include seventh and eighth internal interconnectors 279 and 277 that electrically connect the sixth internal interconnectors 271 to the second connectors 420 disposed on the third surface 209 of the second semiconductor chip 200. The eighth internal interconnectors 277 may be disposed in the base die 270 to connect some of the fourth internal interconnectors 261 in a central portion of the base die 270 to the second group of second connectors 420C disposed on an edge of the base die 270, that is, an edge of the second semiconductor chip 200. The eighth internal interconnectors 277 may constitute a PHY region of a second interface 272. The PHY region of the second interface 272 may be disposed to face the first semiconductor chip 100. Thus, the second interface 272 may be connected to the first semiconductor chip 100 through only the second group of second connectors 420C. As a result, a length of interconnection lines between the PHY region of the second interface 272 and the first semiconductor chip 100 may be minimized.

The seventh internal interconnectors 279 may be disposed in the base die 270 to connect some of the fourth internal interconnectors 261 in a central portion of the base die 270 to the first group of second connectors 420B disposed on another edge of the base die 270 (i.e., another edge of the second semiconductor chip 200). The seventh internal interconnectors 279 and the first group of second connectors 420B may constitute a direct access region that electrically connects the semiconductor die 250 to the first interposer (300A of FIG. 3). The direct access region may be disposed to provide direct access paths between the interposer 300 and the second semiconductor chip 200 without interposition of the first semiconductor chip 100. This direct access paths between the interposer 300 and the second semiconductor chip 200 may be used as signal paths while the second semiconductor chip 200 is tested.

The second semiconductor chip 200 including the base die 270 and the semiconductor die 250 vertically stacked may be provided in a HBM chip form.

FIGS. 10 to 17 are cross-sectional views illustrating representations of examples of a method of manufacturing semiconductor packages according to an embodiment.

Figure 10:
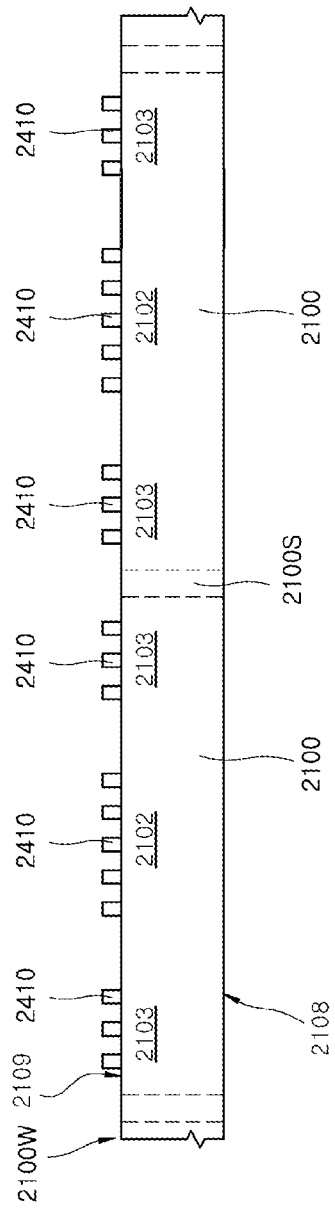
FIGS. 10 to 17 are cross-sectional views illustrating representations of examples of a method of manufacturing semiconductor packages according to an embodiment.

Referring to FIG. 10, a semiconductor wafer 2100W including first semiconductor chips 2100 is provided. The first semiconductor chips 2100 may be formed by various processes used in fabrication of semiconductor devices. Each of the first semiconductor chips 2100 may correspond to the first semiconductor chip 100 described with reference to FIGS. 1 to 3. The first semiconductor chips 2100 may be formed to be spaced apart from each other by scribe lanes 2100S. That is, the scribe lanes 2100S may be defined as boundary regions or border regions between the first semiconductor chips 2100.

First connectors 2410 may be formed on fifth surfaces 2109 of the first semiconductor chips 2100. The first connectors 2410 formed on each of the first semiconductor chips 2100 may include a first group of first connectors (410A of FIG. 3) disposed on a portion of a second region 2103 (corresponding to the second region 103 of FIG. 3) of the first semiconductor chip 2100, a second group of first connectors (410B of FIG. 3) disposed on a portion of a first region 2102 (corresponding to the first region 102 of FIG. 3) of the first semiconductor chip 2100, a third group of first connectors (410C of FIG. 3) disposed on the other portion of the first region 2102 of the first semiconductor chip 2100, and a fourth group of first connectors (410D of FIG. 3) disposed on the other portion of the second region 2103 of the first semiconductor chip 2100. The first connectors 2410 may be formed of micro bumps.

As described with reference to FIG. 3, the first group of second coupling structures (403A of FIG. 3) may be connected to the first group of first coupling structures (402B of FIG. 3) through the first internal interconnector (141 of FIGS. 3 and 4). Thus, interconnection lines corresponding to the first internal interconnector (141 of FIGS. 3 and 4) may be formed on the fifth surface 2109 of each of the first semiconductor chip 2100 to electrically connect the first group of second coupling structures (403A of FIG. 3) to the first group of first coupling structures (402B of FIG. 3).

Figure 11:
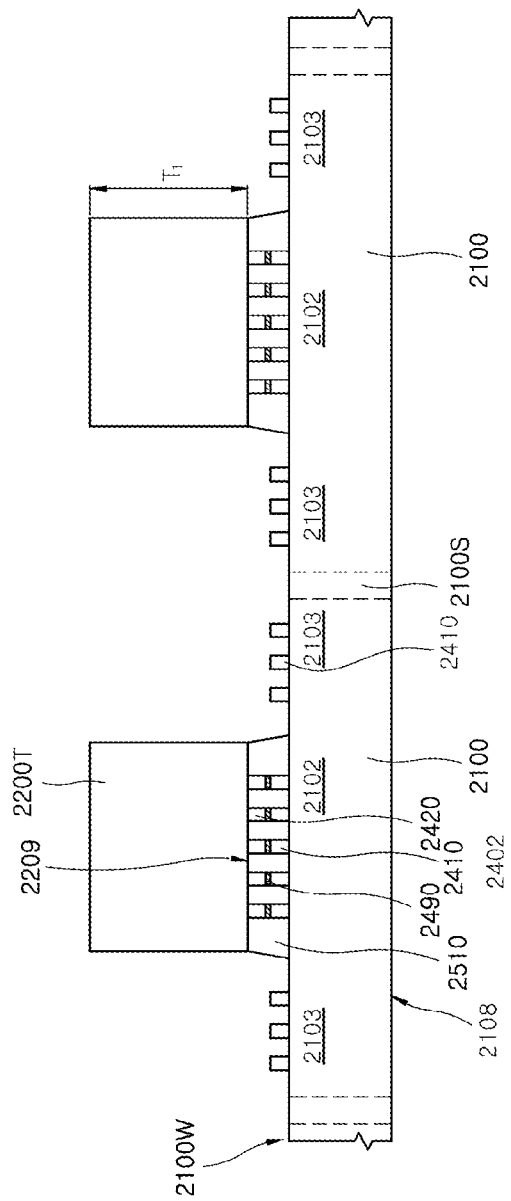

FIG. 11 illustrates a representation of an example of a step of disposing second semiconductor chips 2200T.

Referring to FIG. 11, the second semiconductor chips 2200T may be mounted on the semiconductor wafer 2100W. Each of the second semiconductor chips 2200T may be introduced to provide a semiconductor chip corresponding to the second semiconductor chip 200 described with reference to FIGS. 1 and 3. The second semiconductor chips 2200T may be provided to have a thickness T1 greater than a thickness of the second semiconductor chip 200. Before the second semiconductor chips 2200T are mounted on the semiconductor wafer 2100W, second connectors 2420 may be formed on a third surface 2209 of each of the second semiconductor chips 2200T. While the second semiconductor chips 2200T are mounted on the semiconductor wafer 2100W, the second connectors 2420 may be combined with some of the first connectors 2410 using conductive interconnectors 2490.

Some of the second connectors 2420 of each second semiconductor chip 2200T may include the first group of second connectors (420B of FIG. 3) described with reference to FIG. 3 and may be combined with the second group of first connectors (410B of FIG. 3) to constitute the first group of first coupling structures (402B of FIG. 3) corresponding to some of first coupling structures 2402. In addition, the others of the second connectors 2420 of each second semiconductor chip 2200T may include the second group of second connectors (420C of FIG. 3) described with reference to FIG. 3 and may be combined with the third group of first connectors (410C of FIG. 3) to constitute the second group of first coupling structures (402C of FIG. 3) corresponding to the others of the first coupling structures 2402. An underfill layer 2510 may be introduced into gaps between the first semiconductor chip 2100 and the second semiconductor chip 2200T.

Figure 12:
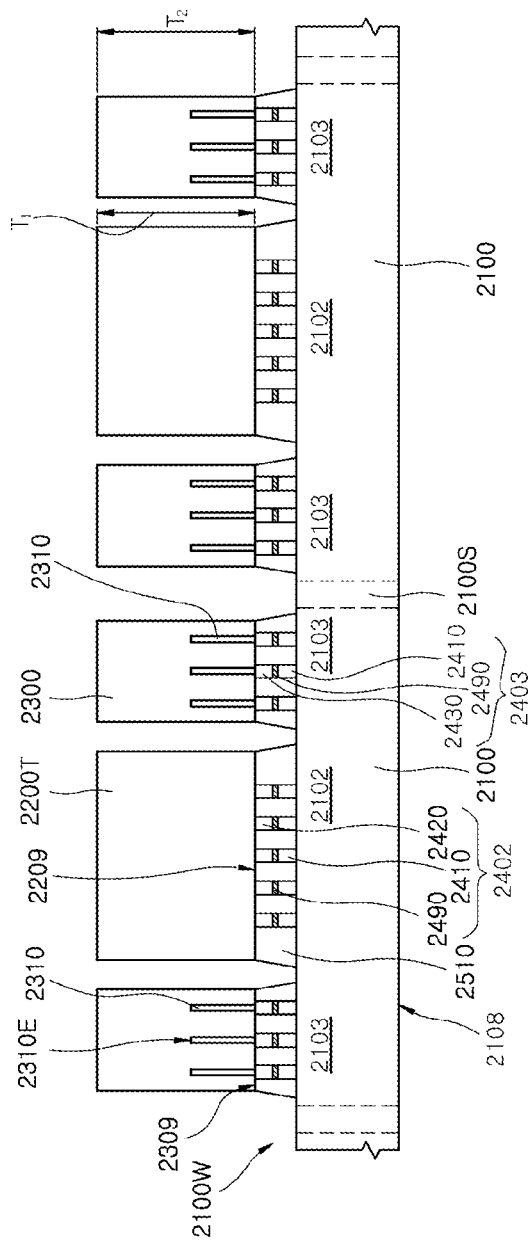

FIG. 12 illustrates a representation of an example of a step of disposing interposers 2300.

Referring to FIG. 12, the interposers 2300 may be mounted on the semiconductor wafer 2100W so that the interposers 2300 and the second semiconductor chips 2200T are disposed side-by-side. The interposers 2300 may be provided in an interposer substrate form, as described with reference to FIGS. 1 and 3. The interposers 2300 may be have a thickness T2 greater than a thickness of the interposer 300 illustrated in FIG. 3. In some embodiments, the thickness T2 of the interposers 2300 may be equal to the thickness T1 of the second semiconductor chips 2200T. Alternatively, the thickness T2 of the interposers 2300 may be different from the thickness T1 of the second semiconductor chips 2200T.

Before the interposers 2300 are mounted on the semiconductor wafer 2100W, third connectors 2430 may be formed on a first surface 2309 of each of the interposers 2300. While the interposers 2300 are mounted on the semiconductor wafer 2100W, the third connectors 2430 may be combined with some of the first connectors 2410.

Some of the third connectors 2430 may correspond to the second group of third connectors 430B described with reference to FIG. 3 and may be combined with the fourth group of first connectors (410D of FIG. 3) through the conductive interconnectors 2490 to constitute the second group of second coupling structures (403B of FIG. 3) corresponding to some of second coupling structures 2403.

The others of the third connectors 2430 may correspond to the first group of third connectors 430A described with reference to FIG. 3 and may be combined with the first group of first connectors (410A of FIG. 3) through the conductive interconnectors 2490 to constitute the first group of second coupling structures (403A of FIG. 3) corresponding to the others of the second coupling structures 2403.

Each of the interposers 2300 may include second internal interconnectors 2310 extending from the third connectors 2430 on the first surface 2430 into a body of the interposer 2300. Ends 2310E of the second internal interconnectors 2310 opposite to the third connectors 2430 may be buried in the body of the interposer 2300 without penetrating the interposer 2300. The second internal interconnectors 2310 may be TSVs.

Figure 13:
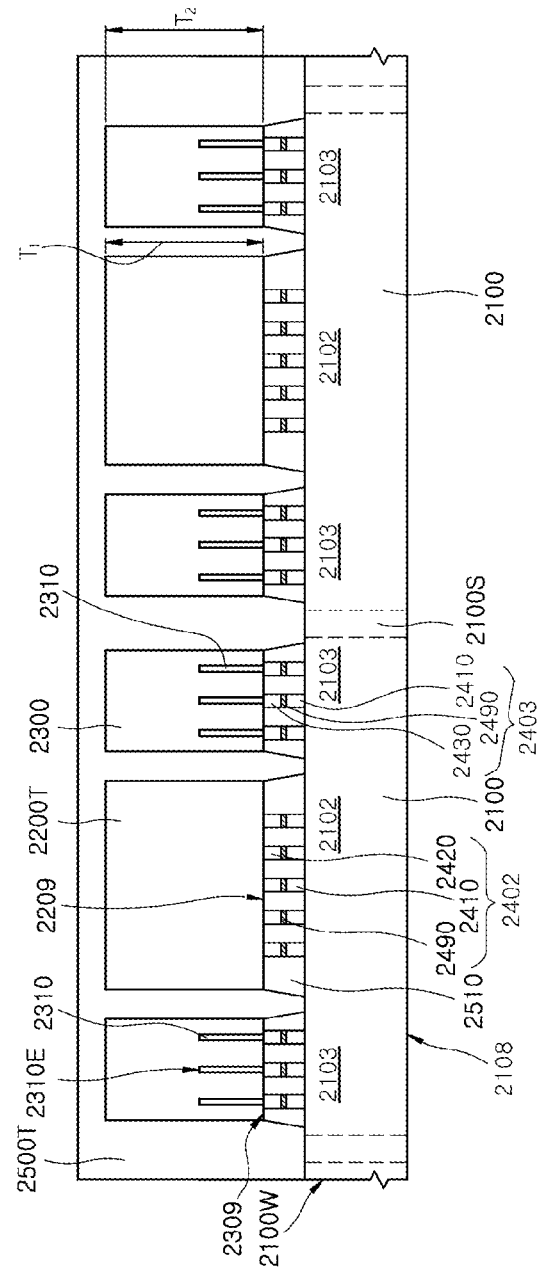

FIG. 13 illustrates a representation of an example of a step of forming a dielectric layer 2500T.

Referring to FIG. 13, the dielectric layer 2500T may be formed on the semiconductor wafer 2100W to cover the second semiconductor chips 2200T and the interposers 2300. The dielectric layer 2500T may be formed to fill gaps between the second semiconductor chips 2200T and the interposers 2300. The dielectric layer 2500T may be formed of an EMC material using a molding process.

Figure 14:
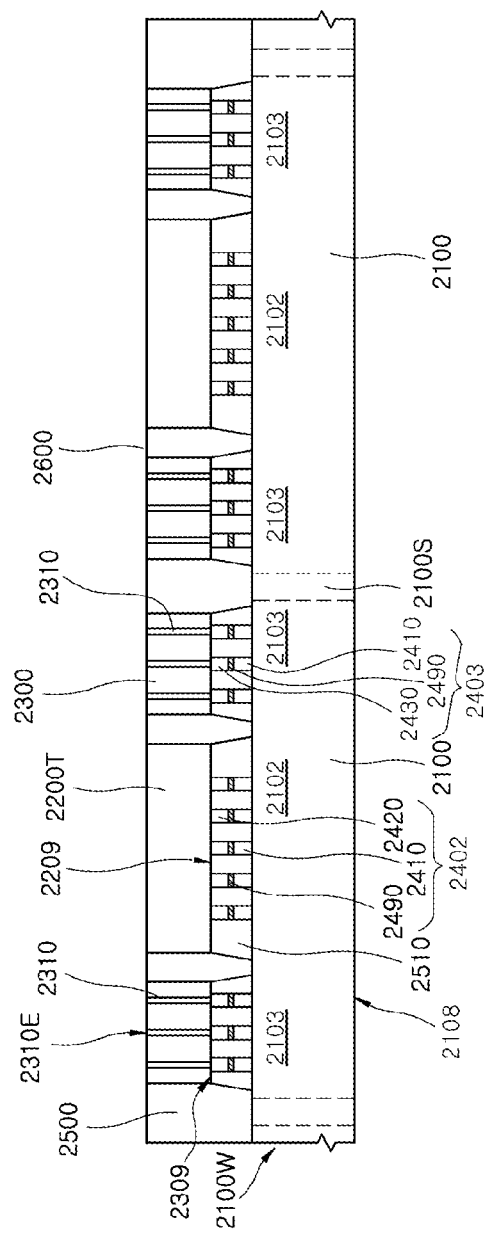

FIG. 14 illustrates a representation of an example of a step of reducing the thickness of the second semiconductor chips 2200T and the interposers 2300.

Referring to FIG. 14, the thickness of the second semiconductor chips 2200T and the interposers 2300 may be reduced to expose the ends 2310E of the second internal interconnectors 2310. Specifically, the dielectric layer 2500T may be etched using a planarization process such as a recess process, a polishing process or an etch-back process to expose the second semiconductor chips 2200T and the interposers 2300, and the exposed second semiconductor chips 2200T and the exposed interposers 2300 may also be etched using the planarization process until the ends 2310E of the second internal interconnectors 2310 are exposed. As a result, the second semiconductor chips 2200T and the interposers 2300 may be planarized to have a thickness less than the initial thicknesses T1 and T2. Even though the initial thickness T1 of the second semiconductor chips 2200T is different from the initial thickness T2 of the interposers 2300, the thickness of the planarized second semiconductor chips 2200T may be substantially equal to the thickness of the planarised interposers 2300. Thus, surfaces of the planarized second semiconductor chips 2200T opposite to the semiconductor wafer 2100W may be substantially coplanar with surfaces of the planarised interposers 2300 opposite to the semiconductor wafer 2100W.

Figure 15:
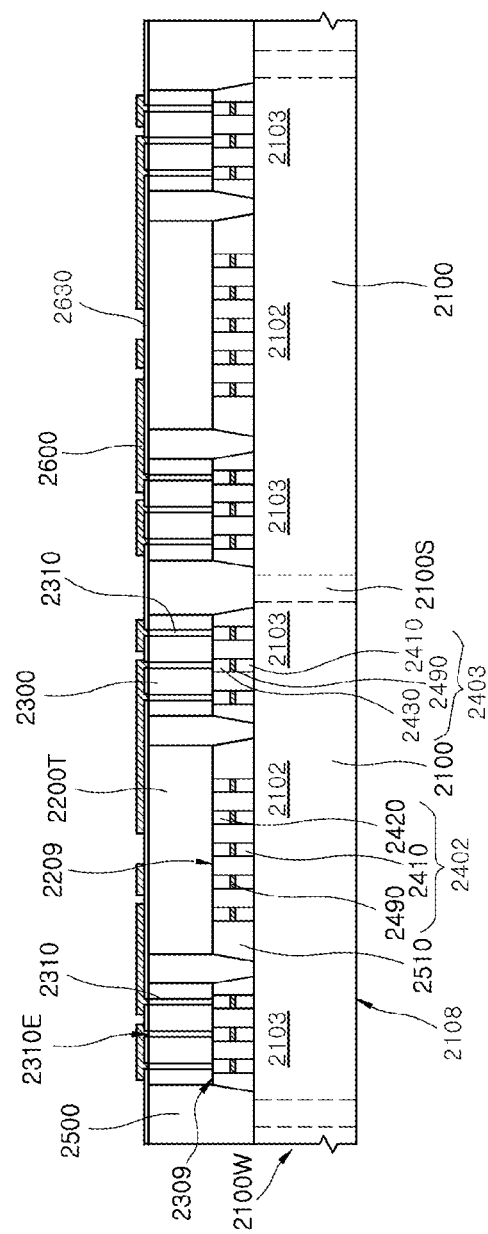

FIG. 15 illustrates a representation of an example of a step of forming external interconnectors 2600.

Referring to FIG. 15, the external interconnectors 2600 may be formed on the surfaces of the planarized second semiconductor chips 2200T, the planarised interposers 2300 and the planarized dielectric layer 2500. The external interconnectors 2600 may be used as redistribution lines. The external interconnectors 2600 may be formed by depositing a conductive layer and by patterning the conductive layer. The external interconnectors 2600 may be formed to have trace pattern shapes. The surfaces of the planarized second semiconductor chips 2200T, the planarised interposers 2300 and the planarized dielectric layer 2500 may provide a global flat surface without uneven surface profiles. Accordingly, the external interconnectors 2600 may be formed to have a fine size. That is, the external interconnectors 2600 may be formed to have a fine pitch and may be used as highly integrated circuit patterns.

Figure 16:
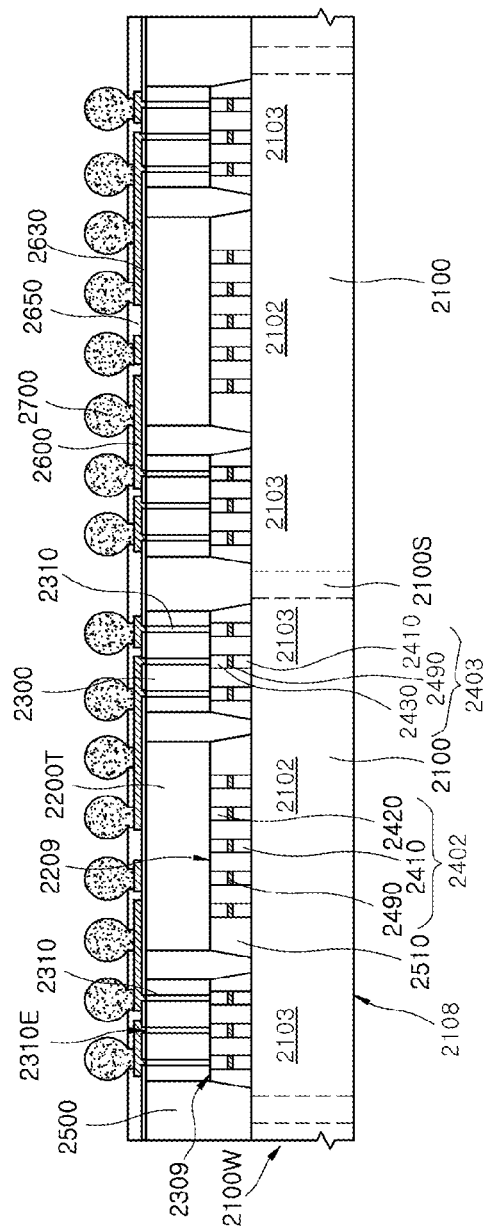

FIG. 16 illustrates a representation of an example of a step of forming first external connectors 2700.

Referring to FIG. 16, a second protection layer 2650 may be formed on the surfaces of the planarized second semiconductor chips 2200T, the planarised interposers 2300 and the planarised dielectric layer 2500. The second protection layer 2650 may be formed to expose external contact portions of the external interconnectors 2600. The second protection layer 2650 may be formed to include a solder resist layer. The first external connectors 2700 may be formed on the exposed contact portions of the external interconnectors 2600.

Figure 17:
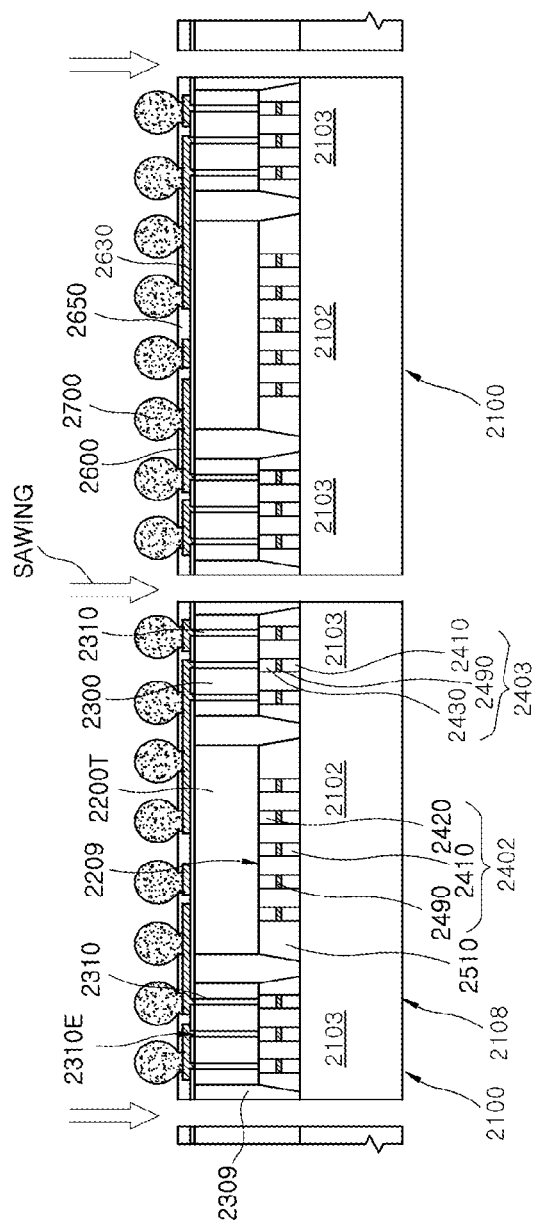

FIG. 17 illustrates a representation of an example of a step of forming separate semiconductor packages.

Referring to FIG. 17, the wafer 2100W may be separated into a plurality of semiconductor packages using a die sawing process performed along the scribe lanes 2100S. Each of the semiconductor packages may correspond to any of the semiconductor packages 10 and 30 described with reference to FIGS. 1 and 3.

As described with reference to FIGS. 10 to 17, the semiconductor packages may be fabricated using a wafer level package technique to provide SIPs.

Figure 18:
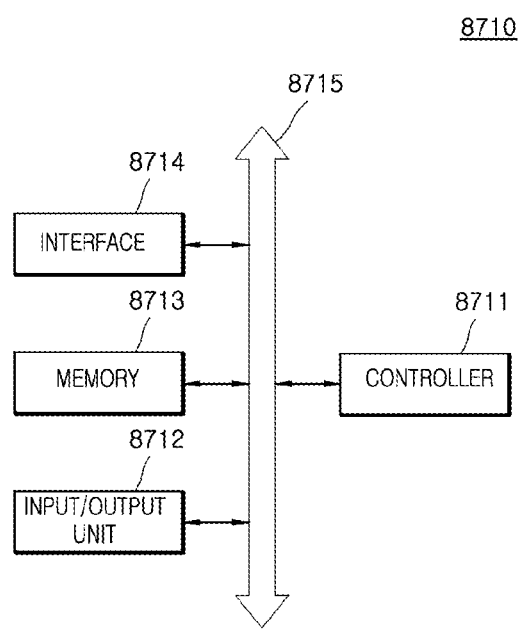
FIG. 18 is a block diagram illustrating a representation of an example of an electronic system including a package according to an embodiment.

FIG. 18 is a block diagram illustrating a representation of an example of an electronic system 8710 including at least one of the packages according to some embodiments. The electronic system 8710 may include a controller 8711, an input/output device 8712, and a memory 8713. The package according to an embodiment may be realized to include the controller 8711 and the memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this example, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
    a first semiconductor chip;
    a second semiconductor chip disposed to overlap with a portion of the first semiconductor chip and connected to the first semiconductor chip through first coupling structures;
    an interposer disposed to overlap with another portion of the first semiconductor chip and connected to the first semiconductor chip through second coupling structures, wherein a first surface of the interposer faces the first semiconductor chip and the interposer includes internal interconnectors extending from the second coupling structures on the first surface to a second surface of the interposer opposite to the first surface; and
    external interconnectors disposed on the second surface of the interposer and connected to the internal interconnectors
    wherein at least one of the external interconnectors extends onto a first surface of the second semiconductor chip opposite to a second surface of the second semiconductor chip facing the first semiconductor chip.

2. The semiconductor package of claim 1, wherein the interposer and the second semiconductor chip are disposed side-by-side on the first semiconductor chip.

3. The semiconductor package of claim 2, further comprising a dielectric layer configured to fill a gap between the interposer and the second semiconductor chip and expose the second surface of the interposer and the first surface of the second semiconductor chip.

4. The semiconductor package of claim 3, wherein at least one of the external interconnectors extends onto a surface of the dielectric layer adjacent to the second surface of the interposer.

5. The semiconductor package of claim 3, wherein the second surface of the interposer is substantially coplanar with the first surface of the second semiconductor chip.

6. The semiconductor package of claim 3,
    wherein a surface of the dielectric layer is substantially coplanar with the second surface of the interposer and the first surface of the second semiconductor chip; and
    wherein the surface of the dielectric layer connects the second surface of the interposer to the first surface of the second semiconductor chip.

7. The semiconductor package of claim 1, wherein some of the second coupling structures and some of the internal interconnectors provide first electrical paths electrically connecting the first semiconductor chip to some of the external interconnectors.

8. The semiconductor package of claim 7, wherein the others of the second coupling structures, the others of the internal interconnectors and some of the first coupling structures provide second electrical paths electrically connecting the second semiconductor chip to some of the external interconnectors through the first semiconductor chip.

9. The semiconductor package of claim 8, further comprising first internal interconnectors electrically connecting others of the second coupling structures to some of the first coupling structures.

10. The semiconductor package of claim 8, wherein each of the internal interconnectors includes a through silicon via (TSV) that substantially penetrates the interposer.

11. The semiconductor package of claim 8, wherein the others of the first coupling structures provide third electrical paths electrically connecting the second semiconductor chip to the first semiconductor chip.

12. The semiconductor package of claim 1,
    wherein the second semiconductor chip overlaps with a central portion of the first semiconductor chip; and
    wherein the interposer includes a first interposer and a second interposer, the first and second interposers overlapping with both edges of the first semiconductor chip, respectively.

13. The semiconductor package of claim 1, further comprising a heat spreader disposed on a first surface of the first semiconductor chip opposite to a second surface of the first semiconductor chip facing the second semiconductor chip,
    wherein the second surface of the first semiconductor chip faces the second semiconductor chip and the interposer.

14. The semiconductor package of claim 1, further comprising first external connectors attached to the external interconnectors, respectively.

15. The semiconductor package of claim 14, further comprising:
    a package substrate having second external connectors configured for electrically connecting to the first external connectors; and
    a protection layer configured to cover the first and second semiconductor chips mounted on the package substrate.

16. The semiconductor package of claim 1, wherein the second semiconductor chip includes a high bandwidth memory (HBM) chip in which a plurality of memory chips having through silicon vias (TSVs) are stacked.

17. The semiconductor package of claim 1,
    wherein the first coupling structures includes:
    a first group of first connectors disposed on a surface of the first semiconductor chip; and
    second connectors disposed on a surface of the second semiconductor chip and respectively combined with the first group of first connectors, and
    wherein the second coupling structures includes:
    a second group of first connectors disposed on a surface of the first semiconductor chip; and
    third connectors disposed on a surface of the interposer and respectively combined with the second group of first connectors.

18. A semiconductor package comprising:
    a first semiconductor chip including a first group of first connectors, a second group of first connectors, a third group of first connectors, and a fourth group of first connectors disposed on a surface of the first semiconductor chip and including first internal interconnectors configured for connecting the first group of first connectors to the second group of first connectors;
    a second semiconductor chip overlapping with a portion of the first semiconductor chip and including a first group of second connectors and a second group of second connectors disposed on a surface of the second semiconductor chip, wherein the first group of second connectors are respectively combined with the second group of first connectors and the second group of second connectors are respectively combined with the third group of first connectors;

an interposer overlapping with another portion of the first semiconductor chip and including a first group of third connectors respectively combined with the first group of first connectors and a second group of third connectors respectively combined with the fourth group of first connectors, wherein the first group of third connectors and the second group of third connectors are disposed on a first surface of the interposer and the interposer includes internal interconnectors extending from the third connectors to a second surface of the interposer opposite to the first surface; and external interconnectors disposed on the second surface of the interposer and connected to the internal interconnectors.

19. A semiconductor package comprising:

a first semiconductor chip;

a second semiconductor chip disposed to be electrically connected to a portion of the first semiconductor chip;

an interposer including internal interconnectors electrically connected to another portion of the first semiconductor chip;

a dielectric layer configured to fill a gap between the second semiconductor chip and the interposer and to expose a surface of the second semiconductor chip opposite to the first semiconductor chip and a surface of the interposer opposite to the first semiconductor chip; and external interconnectors disposed on the surfaces of the second semiconductor chip and the interposer opposite to the first semiconductor chip and on a surface of the dielectric layer, wherein the external interconnectors are connected to the internal interconnectors.

* * * * *